United States Patent
Garrity (10) Patent No.: US 8,542,512 B2
(45) Date of Patent: Sep. 24, 2013

(54) SOLAR PHOTOVOLTAIC INVERTERS

(75) Inventor: Paul Garrity, Rockwall, TX (US)

(73) Assignee: Enecsys Limited, Cambridge (GB)

( * ) Notice: Subject to any disclaimer, the term of this patent is extended or adjusted under 35 U.S.C. 154(b) by 19 days.

(21) Appl. No.: 13/244,155

(22) Filed: Sep. 23, 2011

(65) Prior Publication Data

US 2012/0057388 A1 Mar. 8, 2012

(30) Foreign Application Priority Data

Mar. 22, 2011 (GB) .................................. 1104785.9

(51) Int. Cl.
*H02M 7/537* (2006.01)
*H05K 9/00* (2006.01)

(52) U.S. Cl.
USPC .......................................... 363/131; 361/816

(58) Field of Classification Search
USPC ............. 363/97, 98, 131, 132, 144; 361/601, 361/676, 679.01, 728–730, 736, 748, 752, 361/816
See application file for complete search history.

(56) References Cited

U.S. PATENT DOCUMENTS

| | | | |
|---|---|---|---|
| 6,094,129 A | 7/2000 | Baiatu | |
| 6,307,749 B1 | 10/2001 | Daanen et al. | |
| 6,560,131 B1 * | 5/2003 | vonBrethorst | 363/146 |
| 6,709,291 B1 | 3/2004 | Wallace et al. | |
| 6,812,396 B2 | 11/2004 | Makita et al. | |
| 7,388,348 B2 * | 6/2008 | Mattichak | 320/101 |
| 7,955,134 B2 * | 6/2011 | Donth et al. | 439/620.26 |
| 2002/0165458 A1 | 11/2002 | Carter et al. | |
| 2002/0179140 A1 | 12/2002 | Toyomura | |
| 2004/0076028 A1 | 4/2004 | Achleitner et al. | |
| 2010/0176534 A1 | 7/2010 | Fornage | |
| 2011/0083733 A1 * | 4/2011 | Marroquin et al. | 136/256 |
| 2011/0222244 A1 * | 9/2011 | Takashiro et al. | 361/704 |
| 2011/0298305 A1 | 12/2011 | Chisenga et al. | |
| 2012/0050999 A1 * | 3/2012 | Cooper et al. | 361/722 |

FOREIGN PATENT DOCUMENTS

| | | |
|---|---|---|
| CN | 101877166 | 11/2010 |
| DE | 10345302 | 4/2005 |
| DE | 102004043478 | 4/2005 |
| DE | 102009001373 | 9/2010 |
| GB | 2327208 | 1/1999 |
| GB | 2482653 | 2/2012 |

(Continued)

OTHER PUBLICATIONS

Portions of prosecution history of GB 1104785, Mar. 1, 2012 (mailing date), Enecsys Limited.
International Search Report and Written Opinion of PCT/GB2012/050516, Dec. 11, 2012 (mailing date), Enecsys Limited.

*Primary Examiner* — Matthew Nguyen
(74) *Attorney, Agent, or Firm* — Adeli & Tollen LLP (57) ABSTRACT

The invention relates to improved techniques for manufacturing power conditioning units (inverters) for use with photovoltaic (PV) modules, and to inverters manufactured by these techniques. We describe a solar photovoltaic inverter, comprising: a power conditioning circuit mounted on a circuit board, the power conditioning circuit having a dc power input to receive dc power from one or more photovoltaic panels and an ac power output to deliver ac power to an ac mains power supply; an electrically conductive shield enclosing said circuit board; and a plastic overmould over said conductive shield and said circuit board; wherein said electrically conductive shield has one or more holes to allow said plastic overmould to extend through said shield to cover said circuit board.

18 Claims, 10 Drawing Sheets

(56) References Cited

FOREIGN PATENT DOCUMENTS

| | | |
|---|---|---|
| GB | 2485335 | 5/2012 |
| GB | 2486032 | 6/2012 |
| WO | WO 02/078164 | 10/2002 |
| WO | WO 2007/000697 | 1/2007 |
| WO | WO 2007/080429 | 7/2007 |
| WO | WO 2008/144554 | 11/2008 |
| WO | WO 2010/144637 | 12/2010 |
| WO | WO 2012/127209 | 9/2012 |

* cited by examiner

SOLAR PHOTOVOLTAIC INVERTERS

CLAIM OF BENEFIT TO PRIOR APPLICATIONS

This application claims benefit of an earlier-filed United Kingdom Patent Application 1104785.9, filed Mar. 22, 2011, which is incorporated herein by reference.

FIELD OF THE INVENTION

This invention relates to power conditioning units (inverters) for use with photovoltaic (PV) modules for delivering ac power either directly to the mains (grid) utility supply or for powering mains (grid) devices directly, independently from the mains utility supply. More particularly the invention relates to improved techniques for manufacturing such inverters, and to inverters manufactured by these techniques.

BACKGROUND TO THE INVENTION

We have previously described a range of improved techniques for increasing reliability and efficiency in photovoltaic inverters (see, for example, WO2007/080429 and others of our published patent applications).

We now particularly address problems which can arise with so-called microinverters. A microinverter is an inverter dedicated to one or a few PV panels, and may be defined as an inverter having a power rating suitable for connection to less than 10 or less than 5 panels (for example less than 1000 watts, often less than 600 watts) and/or as an inverter having a dc input voltage which is less than half a peak-to-peak voltage of the ac mains, more typically less than 100 volts dc or less than 60 volts dc. One of the advantages of a microinverter is that it can be physically located close to the PV panel or panels to which it is connected, thus reducing the voltage drop across the connecting cables (which can be significant). However, locating a microinverter adjacent to or on a PV panel brings other difficulties, in particular because such locations are subject to extreme temperature and environmental conditions including, for example, water, ice, humidity, and dry heat (depending upon the installation, up to or above 80° C.).

The very large temperature excursions, and in particular the extremes of high temperature which may be encountered, create particular difficulties. In addition a microinverter generates heat which increases the internal temperature of the electronic components above the local ambient conditions. Simple potting of the electronic components can in principle help to address some of these issues but in practice air bubbles and the like can give rise to local temperature hotspots (caused by the low thermal conductivity of air), which can lead to reliability problems and premature failure of the inverter.

There therefore exists a need for improved manufacturing techniques for solar photovoltaic inverters, in particular microinverters.

SUMMARY OF THE INVENTION

According to the present invention there is therefore provided a solar photovoltaic inverter, the inverter comprising: a power conditioning circuit mounted on a circuit board, the power conditioning circuit having a dc power input to receive dc power from one or more photovoltaic panels and an ac power output to deliver ac power to an ac mains power supply; an electrically conductive shield enclosing said circuit board; and a plastic overmould over said conductive shield and said circuit board; wherein said electrically conductive shield has one or more holes to allow said plastic overmould to extend through said shield to cover said circuit board.

In embodiments the electrically conductive shield comprises a metal can having portions which fit opposite faces of the circuit board. In embodiments each portion has a flange which fits on, around or against a perimeter of the circuit board, so that the portions of the can clamp around the circuit board. The one or preferably more holes in the conductive shield (or can) enable the plastic, for example polyamide, overmould to be injection moulded over the combination of the circuit board and can. Thus the injection moulded plastic provides a sealed, solid plastic housing which encases the power conditioning circuit, the holes in the can enabling the plastic overmould to pass through the can to overmould the circuit board. The finished item is a robust, solid, sealed plastic unit, which is substantially free of air bubbles, and which provides a high degree of environmental protection. Furthermore the combined overmoulding and can arrangement facilitates the spreading and dissipation of heat from power components on the circuit board, helping to address the issues causing reliability problems.

In some preferred implementations one or more of the magnetic components that is coils, transformers and the like, is/are pre-coated with an elastic material such as silicone. This is because such magnetic components, in particular the core of such components (often comprising a ceramic material), have a different coefficient of thermal expansion to the plastic or polymer overmould. Thus by providing a relatively soft, compressible material between the coil or transformer and the overmould, the core is able to thermally expand without cracking. In some preferred embodiments the power conditioning circuit includes an RF transmitter and/or receiver, for example to permit monitoring and/or control of the solar inverter (as described in our UK patent application number 1017971.1 filed 25 Oct. 2010). In this case, advantageously, the electrical shield can also be employed as an antenna. The shield may float or may be coupled to a ground connection of the power conditioning circuit by a reactive component or circuit, in particular which has low impedance at low frequencies and a high impedance at higher frequencies. When the shield or can is functioning as an antenna preferably the hole or holes in the shield/can have a maximum dimension which is less than a free space wavelength of an operating frequency of the RF transmitter/receiver. More preferably the maximum dimension is less than half a wavelength, most preferably less than a quarter wavelength. In embodiments the power conditioning unit includes a transceiver operating in the 2.45 GHz ISM (industrial, scientific, medical) band, for example a ZigBee™ device, in which case preferably a hole has a maximum dimension of no more than 35 mm.

In some implementations of the technique, dc input and/or ac output cables are overmoulded by injection moulding together with the shield and circuit board. This can help reduce the risk of water ingress through the cables. However an alternative approach, in embodiments preferable, is to replace in particular the dc cable or cables by a modular connector system in which a first interface part is mounted on the circuit board and then overmoulded to leave what is, in effect, a standard interface to the microinverter. Then any of a set of second mateable interface parts may be mated with this first interface part to connect to the photovoltaic panel or panels. This is advantageous because there is at present no universal standard for dc connection to a PV panel or module, and thus were the dc cable or cables to be overmoulded multiple different inverter versions would be needed to interface with multiple different types of PV panel. Instead the aforementioned approach enables a common manufacturing procedure followed by a customisation of the device to interface to a particular panel or panels.

Thus the inverter may be provided with a set of second interface parts each configured to provide a connection to a different type of photovoltaic panel. Additionally or alternatively the set of second interface parts may be configured to make connection with two or more PV panels of the same type, for example to provide the advantages described in our GB1009430.8 and U.S. Ser. No. 12/947,116 patent applications (incorporated by reference). Patent application US12/947,116 is now published as U.S. Patent Publication No. 2011/0298305. Furthermore, because the first interface part is sealed by the overmould, there are no particularly stringent environmental requirements on the modular connector system since this is sealed at/behind the first interface to the circuit board.

In some preferred embodiments the plastic overmould is also configured to define one or more mounting points for the inverter, for example to define a mounting plate and/or one or more tags, ears or the like optionally bearing mounting holes.

in preferred embodiments the inverter is a microinverter, and is preferably configured for mounting behind or adjacent to the PV panel.

In a related aspect the invention provides a method of manufacturing a solar photovoltaic inverter, the method comprising: providing a power conditioning circuit mounted on a circuit board, the power conditioning circuit having a dc power input to receive dc power from one or more photovoltaic panels and an ac power output to deliver ac power to an ac mains power supply; providing an electrically conductive shield enclosing said circuit board; and injection moulding a plastic overmould over said conductive shield and said circuit board; wherein said electrically conductive shield has one or more holes to allow said plastic overmould to extend through said shield to cover said circuit board.

Preferred embodiments of the method further comprise pre-coating a coil or transformer of the inverter with an elastic material prior to the injection moulding, to make provision for thermal expansion of the core of the coil or transformer.

Some preferred embodiments use the shield (or can) as an antenna for an RF communications circuit coupled to a microcontroller of the power conditioning circuit. In this case preferably the one or more holes are arranged so that they have a maximum dimension less than a wavelength, half wavelength or quarter wavelength of a frequency of operation of the RF circuit.

As previously mentioned, In some preferred embodiments the dc power input of the circuit board is provided by a modular connector system for connecting to any of a set of photovoltaic panels (with either the same, or different, types of dc connections).

In embodiments the modular connector system comprises a first interface part and a set of second interface parts to interface with the set of photovoltaic panels, the first part being mateable with any of the second parts. The method may then further comprise overmoulding the first interface part, selecting one or more second interface parts to connect to a PV panel, and then mating the selected second interface part or parts with the first interface part (or parts) subsequent to the overmoulding.

In preferred embodiments the electrically conducted shield comprises a metal can having two parts within which the circuit board is sandwiched to, in combination with the overmoulding, spread and dissipate heat from one or more power components on the circuit board. Such power components may include, for example, one or more power semiconductor switching devices.

In embodiments the overmoulding is used to mount the microinverter on or adjacent to a PV panel, and the injection moulded overmoulding is configured to provide a mounting plate or the like.

In embodiments the injection moulding process comprises injecting the overmould plastic or polymer into an injection moulding tool in which the circuit board and conductive shield (and optionally connecting cables) are located, under pressure to expel air.

BRIEF DESCRIPTION OF THE DRAWINGS

These and other aspects of the invention will now be further described, by way of example only, with reference to the accompanying figures, in which.

DETAILED DESCRIPTION OF PREFERRED EMBODIMENTS

Power Conditioning Units

Figure 1:
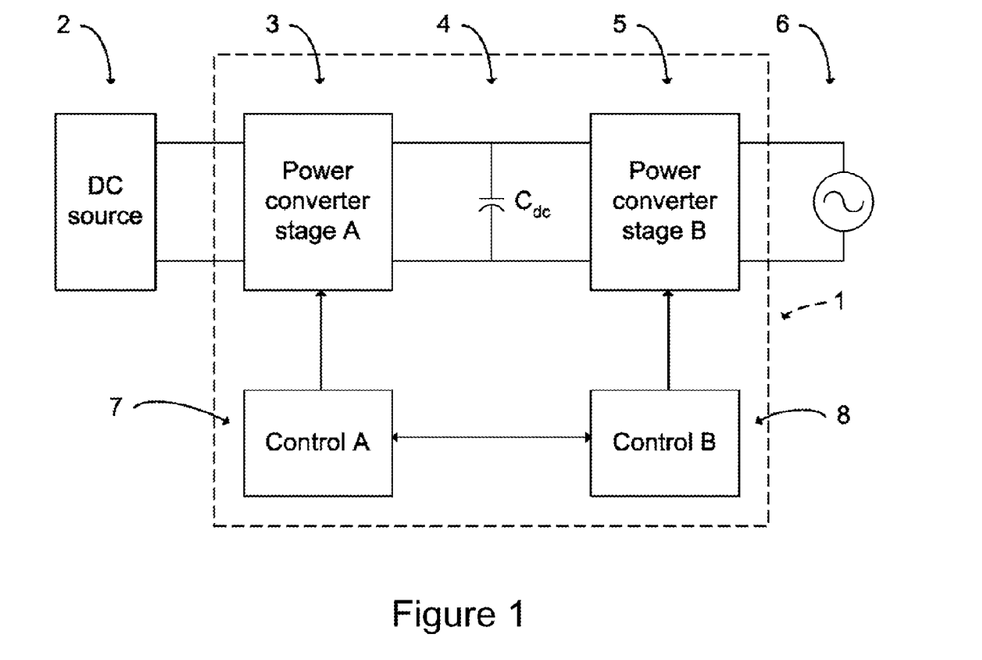
FIG. 1 shows an outline block diagram of an example power conditioning unit.

By way of background, we first describe an example photovoltaic power conditioning unit. Thus FIG. 1 shows photovoltaic power conditioning unit of the type we described in WO2007/080429. The power converter 1 is made of three major elements: a power converter stage A, 3, a reservoir (dc link) capacitor $C_{dc}$ 4, and a power converter stage B, 5. The apparatus has an input connected to a direct current (dc) power source 2, such as a solar or photovoltaic panel array (which may comprise one or more dc sources connected in series and/or in parallel). The apparatus also has an output to the grid main electricity supply 6 so that the energy extracted from the dc source is transferred into the supply.

The power converter stage A may be, for example, a step-down converter, a step-up converter, or it may both amplify and attenuate the input voltage. In addition, it generally provides electrical isolation by means of a transformer or a coupled inductor. In general the electrical conditioning of the input voltage should be such that the voltage across the dc link capacitor $C_{dc}$ is always higher than the grid voltage. In general this block contains one or more transistors, inductors, and capacitors. The transistor(s) may be driven by a pulse width modulation (PWM) generator. The PWM signal(s) have variable duty cycle, that is, the ON time is variable with respect to the period of the signal. This variation of the duty cycle effectively controls the amount of power transferred across the power converter stage A.

The power converter stage B injects current into the electricity supply and the topology of this stage generally utilises some means to control the current flowing from the capacitor $C_{dc}$ into the mains. The circuit topology may be either a voltage source inverter or a current source inverter.

Figure 2A:
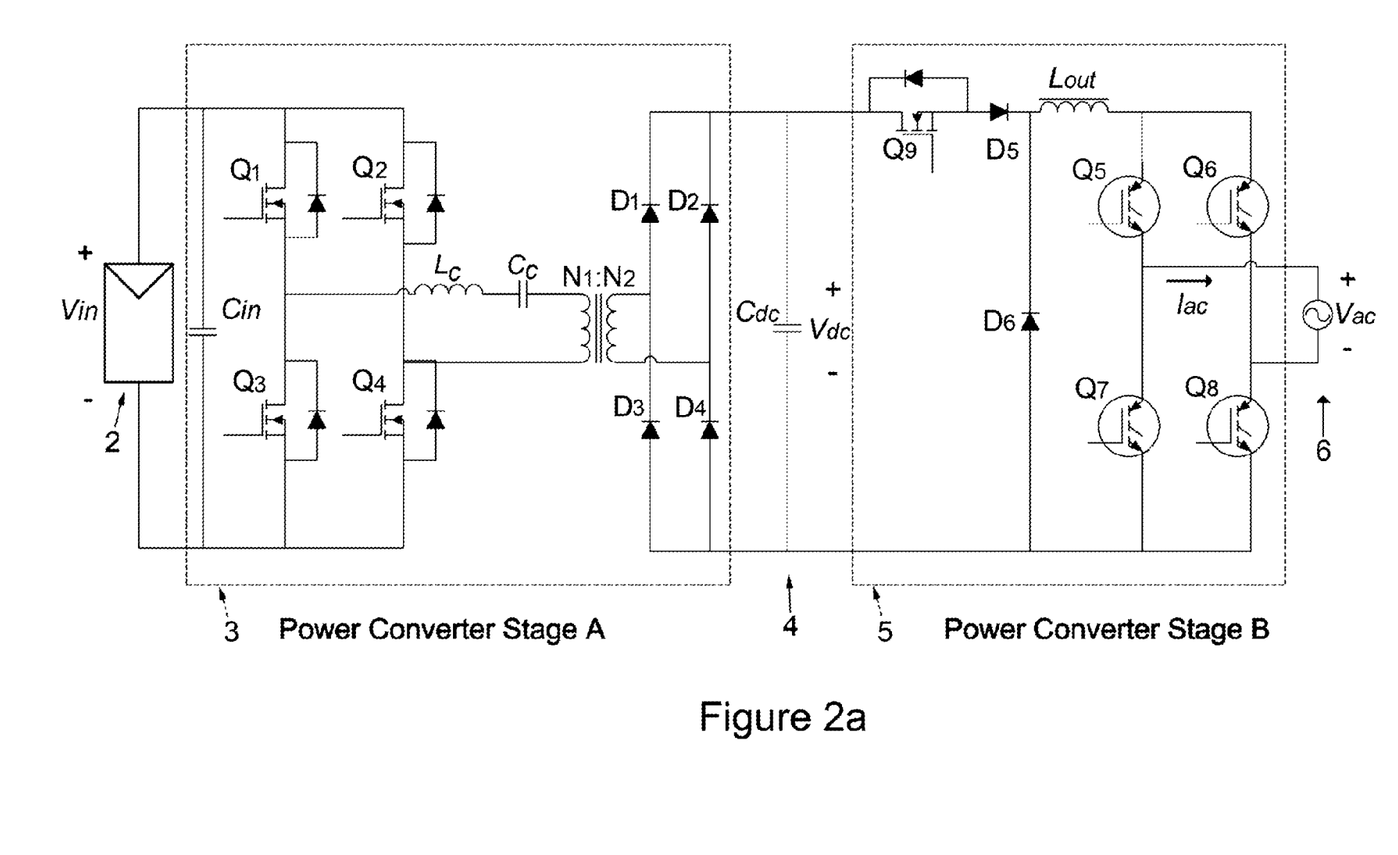
FIGS. 2a and 2b show details of a power conditioning unit of the type shown in FIG. 1.

FIG. 2 shows details of an example of a power conditioning unit of the type shown in FIG. 1; like elements are indicated by like reference numerals. In FIG. 2a Q1-Q4, D1-D4 and the transformer form a dc-to-dc conversion stage, here a voltage amplifier. In alternative arrangements only two transistors may be used; and/or a centre-tapped transformer with two back-to-back diodes may be used as the bridge circuit. In the dc-to-ac converter stage, Q9, D5, D6 and Lout perform current shaping. In alternative arrangements layout may be located in a connection between the bridge circuit and the dc link capacitor. Transistors Q5-Q8 constitutes an "unfolding" stage. Thus these transistors Q5-Q8 form a full-bridge that switches at line frequency using an analogue circuit synchronised with the grid voltage. Transistors Q5 and Q8 are on during the positive half cycle of the grid voltage and Q6 and Q7 are on during the negative half cycle of the grid voltage.

Control (block) A of FIG. 1 may be connected to the control connections (e.g. gates or bases) of transistors in power converter stage A to control the transfer of power from the dc energy source. The input of this stage is connected to the dc energy source and the output of this stage is connected to the dc link capacitor. This capacitor stores energy from the dc energy source for delivery to the mains supply. Control (block) A may be configured to draw such that the unit draws substantially constant power from the dc energy source regardless of the dc link voltage $V_{dc}$ on $C_{dc}$.

Control (block) B may be connected to the control connections of transistors in the power converter stage B to control the transfer of power to the mains supply. The input of this stage is connected to the dc link capacitor and the output of this stage is connected to the mains supply. Control B may be configured to inject a substantially sinusoidal current into the mains supply regardless of the dc link voltage $V_{dc}$ on $C_{dc}$.

The capacitor $C_{dc}$ acts as an energy buffer from the input to the output. Energy is supplied into the capacitor via the power stage A at the same time that energy is extracted from the capacitor via the power stage B. The system provides a control method that balances the average energy transfer and allows a voltage fluctuation, resulting from the injection of ac power into the mains, superimposed onto the average dc voltage of the capacitor $C_{dc}$. The frequency of the oscillation can be either 100 Hz or 120 Hz depending on the line voltage frequency (50 Hz or 60 Hz respectively).

Figure 2B:
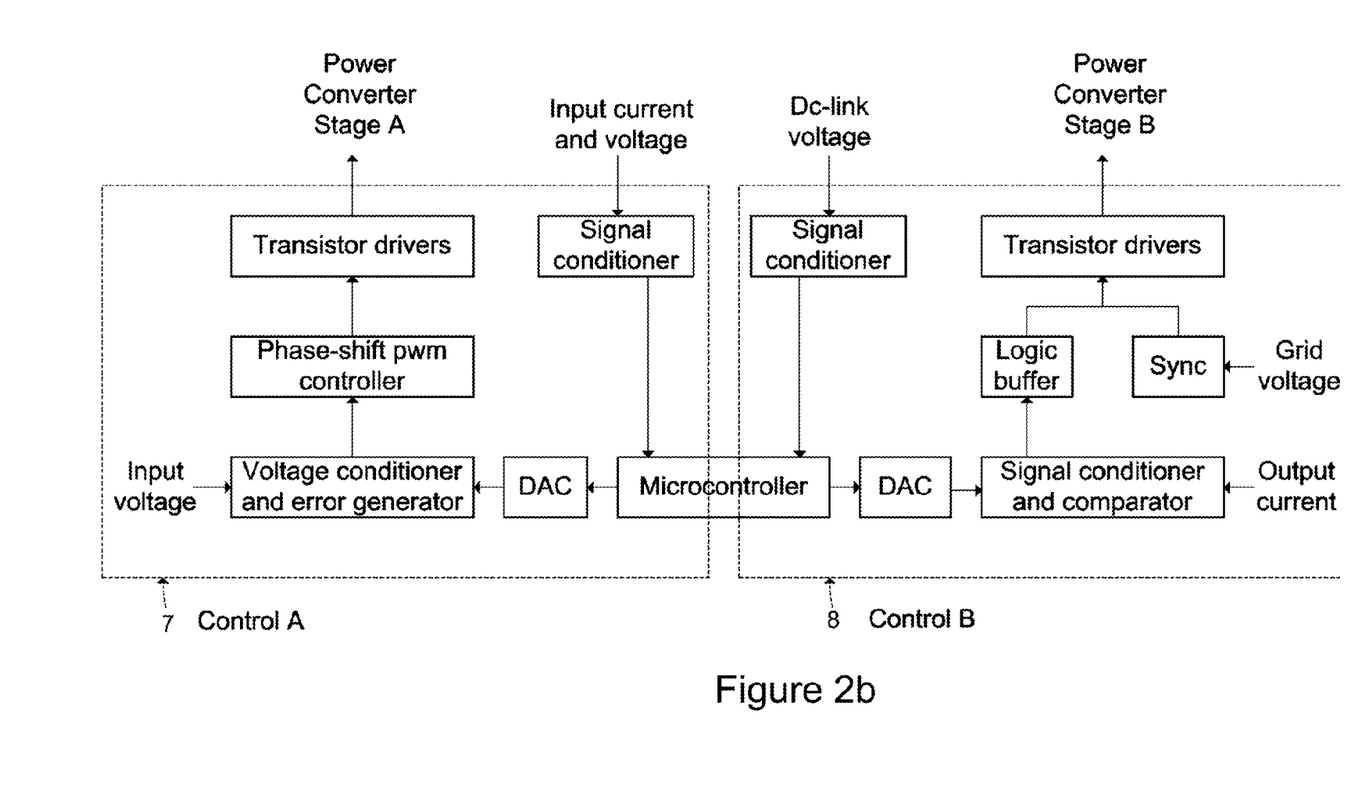

Two control blocks control the system: control block A controls the power stage A, and control block B power stage B. An example implementation of control blocks A and B is shown in FIG. 2b. In this example these blocks operate independently but share a common microcontroller for simplicity.

In broad terms, control block A senses the dc input voltage (and/or current) and provides a PWM waveform to control the transistors of power stage A to control the power transferred across this power stage. Control block B senses the output current (and voltage) and controls the transistors of power stage B to control the power transferred to the mains. Many different control strategies are possible. For example details of one preferred strategy reference may be made to our earlier filed WO2007/080429 (which senses the (ripple) voltage on the dc link)—but the embodiments of the invention we describe later do not rely on use of any particular control strategy.

In a photovoltaic power conditioning unit the microcontroller of FIG. 2b will generally implement an algorithm for some form of maximum power point tracking. In embodiments of the invention we describe later this or a similar microcontroller may be further configured to control whether one or both of the dc-to-dc power converter stages are operational, and to implement "soft" switching off of one of these stages when required. The microcontroller and/or associated hardware may also be configured to interleave the power transistor switching, preferable to reduce ripple as previously mentioned.

Figure 3A:
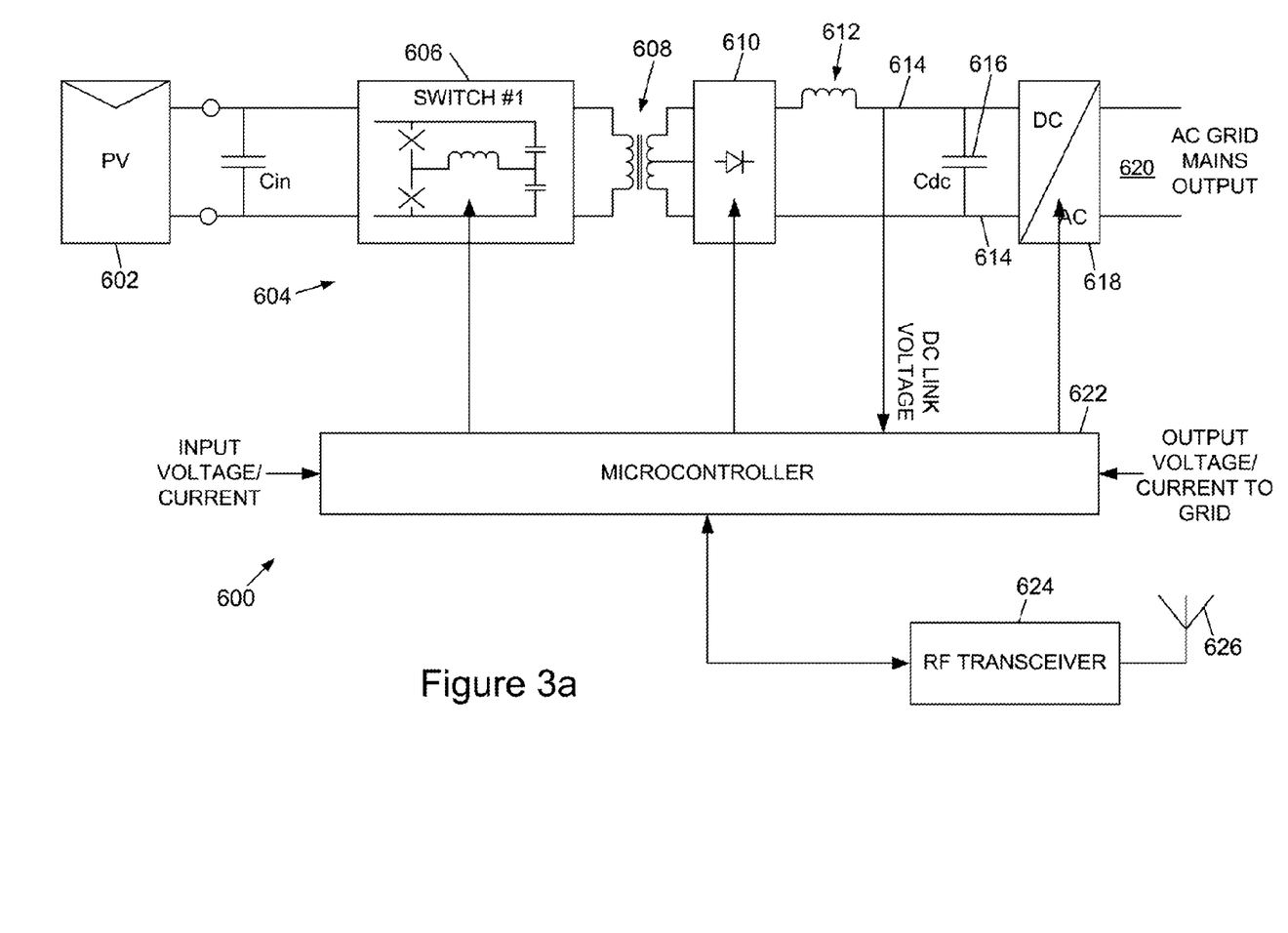
FIGS. 3a and 3b show details of a further example of solar photovoltaic inverter.

Now to FIG. 3a, this shows a further example of a power conditioning unit 600. In the architecture of FIG. 3 a photovoltaic module 602 provides a dc power source for dc-to-dc power conversion stage 604, in this example each comprising an LLC resonant converter. Thus power conversion stage 604 comprises a dc-to-ac (switching) converter stage 606 to convert dc from module 602 to ac for a transformer 608. The secondary side of transformer 608 is coupled to a rectifying circuit 610, which in turn provides a dc output to a series-coupled output inductor 612. Output inductor 612 is coupled to a dc link 614 of the power conditioning unit, to which is also coupled a dc link capacitor 616. A dc-to-ac converter 618 has a dc input from a dc link and provides an ac output 620, for example to an ac grid mains supply.

A microcontroller 622 provides switching control signals to dc-to-ac converter 606, to rectifying circuit 610 (for synchronous rectifiers), and to dc-to-ac converter 618 in the output 'unfolding' stage. As illustrated microcontroller 622 also senses the output voltage/current to the grid, the input voltage/current from the PV module 602, and, in embodiments, the dc link voltage. (The skilled person will be aware of may ways in which such sensing may be performed). In some embodiments the microcontroller 622 implements a control strategy as previously described. As illustrated, Microcontroller is coupled to an RF transceiver 624 such as a ZigBee™ transceiver, which is provided with an antenna 626 for monitoring and control of the power conditioning unit 600.

Figure 3B:
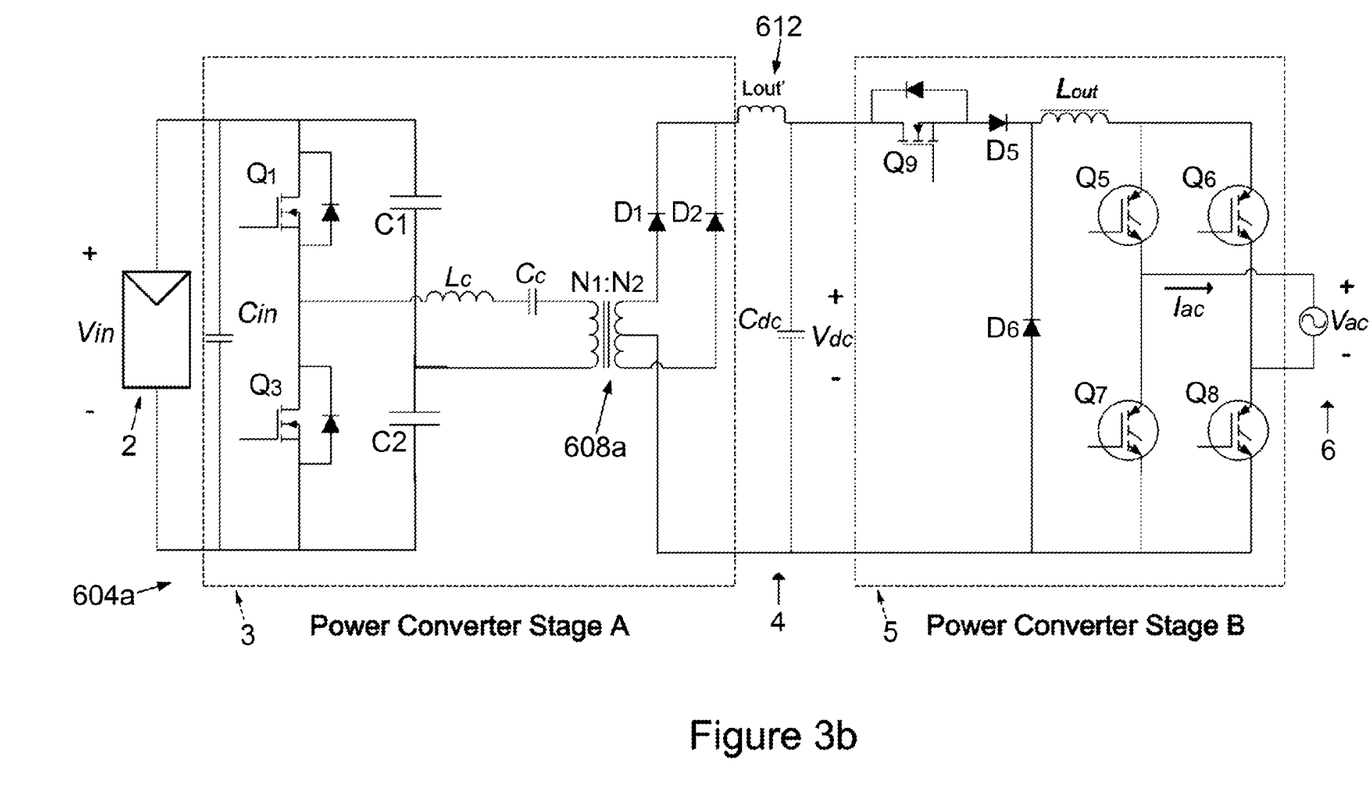

Referring now to FIG. 3b, this shows details of a portion of an example implementation of the arrangement of FIG. 3a. This example arrangement employs a modification of the circuit of FIG. 2a and like elements to those of FIG. 2a are indicated by like reference numerals; likewise like elements to those of FIG. 3a are indicated by like reference numerals. In the arrangement of FIG. 3b an LLC converter is employed (by contrast with FIG. 2a), using a pair of resonant capacitors C1, C3.

The circuits of FIGS. 1 to 3 are particularly useful for microinverters, for example having a maximum rate of power of less than 1000 Watts and or connected to a small number of PV modules, for example just one or two such modules. In such systems the panel voltages can be as low as 20 volts and hence the conversion currents can be in excess of 30 amps RMS.

Manufacturing Techniques

We will now describe techniques which enable a solar microinverter to be encapsulated to provide a combination of thermal management, dielectric resistance, environmental robustness and good electromagnetic emissions performance.

Figure 4A:
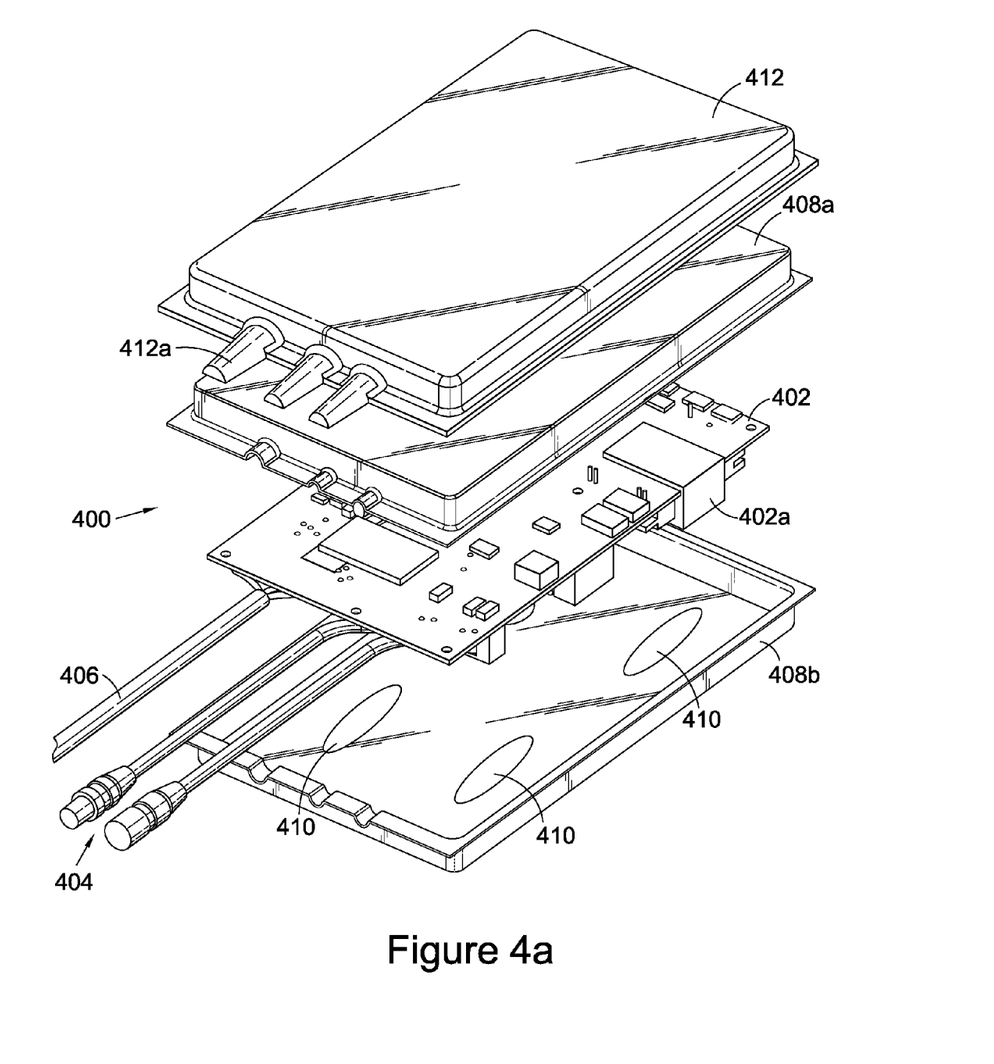
FIGS. 4a and 4b show an exploded views of solar photovoltaic inverters according to embodiments of the invention.
Figure 4B:
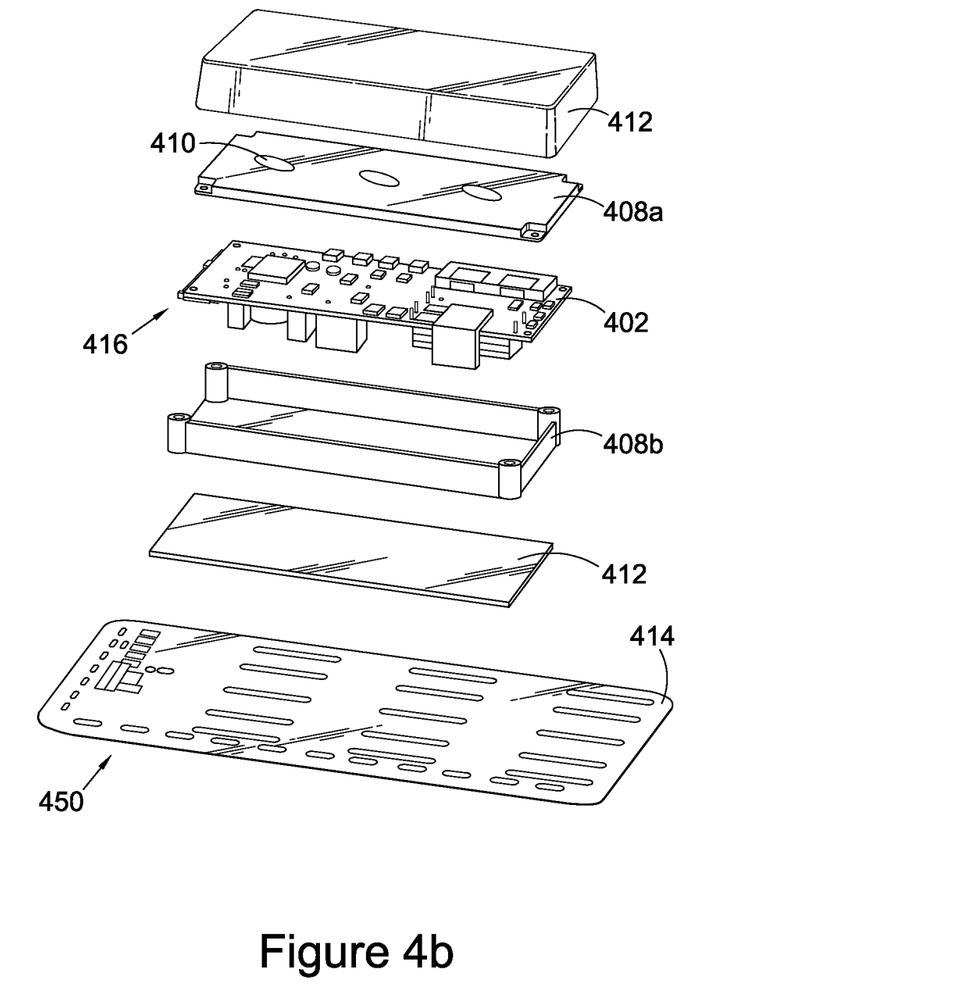

Referring now to FIGS. 4a and 4b, these show an exploded 3-D view of a solar photovoltaic inverter 400 according to an embodiment of the invention. The solar inverter comprises a power conditioning circuit, for example of the type shown in FIGS. 3a and 3b, mounted on a circuit board 402, having, in the illustrated example, two dc power inputs 404 and an ac power output 406, each comprising a cable connection to the circuit board 402. The circuit board is provided with a conductive shield comprising first and second portions 408a, b of a can which substantially encloses the circuit board 402, fitting around the perimeter of the circuit board. The can may be formed, for example, from 0.8 mm-1 mm aluminium, and provides EMC (electromagnetic compatibility) shielding, as well as a thermal conductor for heat spreading/dissipation.

Each of can portions 408a, b is provided with a set of holes 410 (not visible in can portion 408a) and these enable the entire assembly to be overmoulded in an injection moulding process so that the encapsulation becomes the mechanical housing of the device. By providing holes 410 the encapsulating material is able to expel air from the assembly. This means that there is no condensation, no issues associated with thermal expansion of the air, and the injection moulding process ensures that there are no hot spots from residual air bubbles when the inverter is in use.

The injection moulding process is performed in the usual way, by providing a suitable injection moulding tool within which the assembly to overmould is located, the overmoulding, for example of polyamide then being applied under pressure. The mould or tool may be shaped to enable the escape of air through air vents, for example in the parting line of the mould.

The result is a plastic overmould 412. In FIG. 4, for ease of representation, this is not shown as extending through can portion 408a but nonetheless in practice the overmould coats the circuit board 402. Similarly for ease of representation the lower part of overmould 412 is not shown in FIG. 4a. In the illustrated example overmould 412 includes strain relief features 412a for cables 404, 406. The overmould process is able to provide a high degree of environmental sealing/protection, for example up to IP67 or IP68. A high degree of hermetic sealing is also useful where an inverter may need to have a long shelf life, to ensure that there is minimal moisture ingress. The circuit board 402 may include, for example, a transformer 402a, and to prevent cracking of overmoulded core this is preferably pre-coated in silicone to allow for thermal expansion.

FIG. 4b shows another example of a solar photovoltaic inverter 450, very similar to that of FIG. 4a, according to an embodiment of the invention. Like elements to those of FIG. 4a are indicated by like reference numerals. In the arrangement of FIG. 4a the shielding and overmould are asymmetric with respect to the printed circuit board assembly 402. Again not all of holes 410 are shown, and again the full extent of the plastic overmould is omitted, for clarity.

In FIG. 4b the base portion of overmould 412 comprises a base plate with locking features to match an interface base 414, for mounting the inverter on a photovoltaic panel. Optionally the interface base 414 may be incorporated into the overmould 412.

The PCB assembly 402 of FIG. 4b also includes a modular connector system 416, comprising a connector plate which is overmoulded to form a seal behind the plate. This facilitates a manufacturing process in which standard form inverters are overmoulded and then afterwards cable connectors added for the photovoltaic panels by mating a suitable cable connector to the standard interface 416 of the modular connector system.

Figure 5:
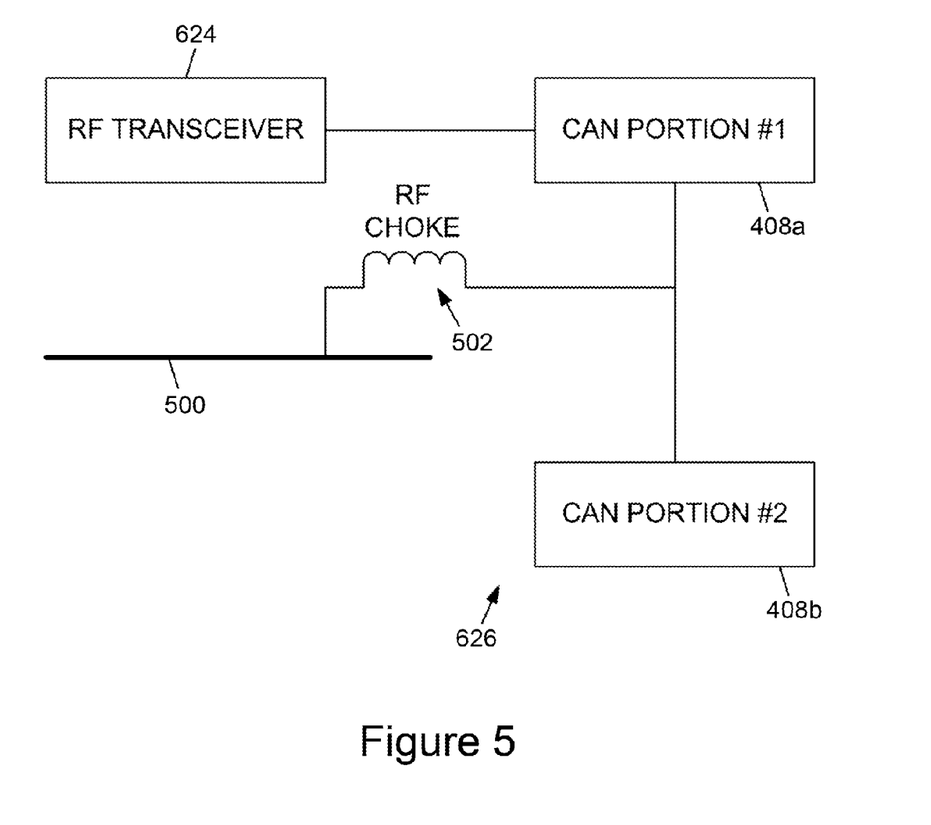
FIG. 5 shows details of an antenna connection for the solar inverters of FIG. 4.

In embodiments one or both can portions 408a, b may be employed as the antenna 626 of the RF transceiver 624 of the FIG. 3a. Referring to FIG. 5, the antenna/shield may either be allowed to float or it may be grounded via an RF choke 502 making connection to a ground line 500 of the inverter.

Where one or both of can portions 408a, b is used as an antenna it is preferable that hole portions 410 have maximum dimension which is no greater than the wavelength at the frequency of operation of RF transceiver 624, preferably no greater than a quarter wavelength so that the holes are effectively 'invisible' to the RF signal. In embodiments the RF transceiver 624 is a ZigBee™ (transceiver) operating at approximately 2.4 GHz, in which case the quarter wavelength dimension is 31.25 mm (although in practice this will be modified a little by the effect of the dielectric overmoulding of the can/antenna).

Figure 6A:
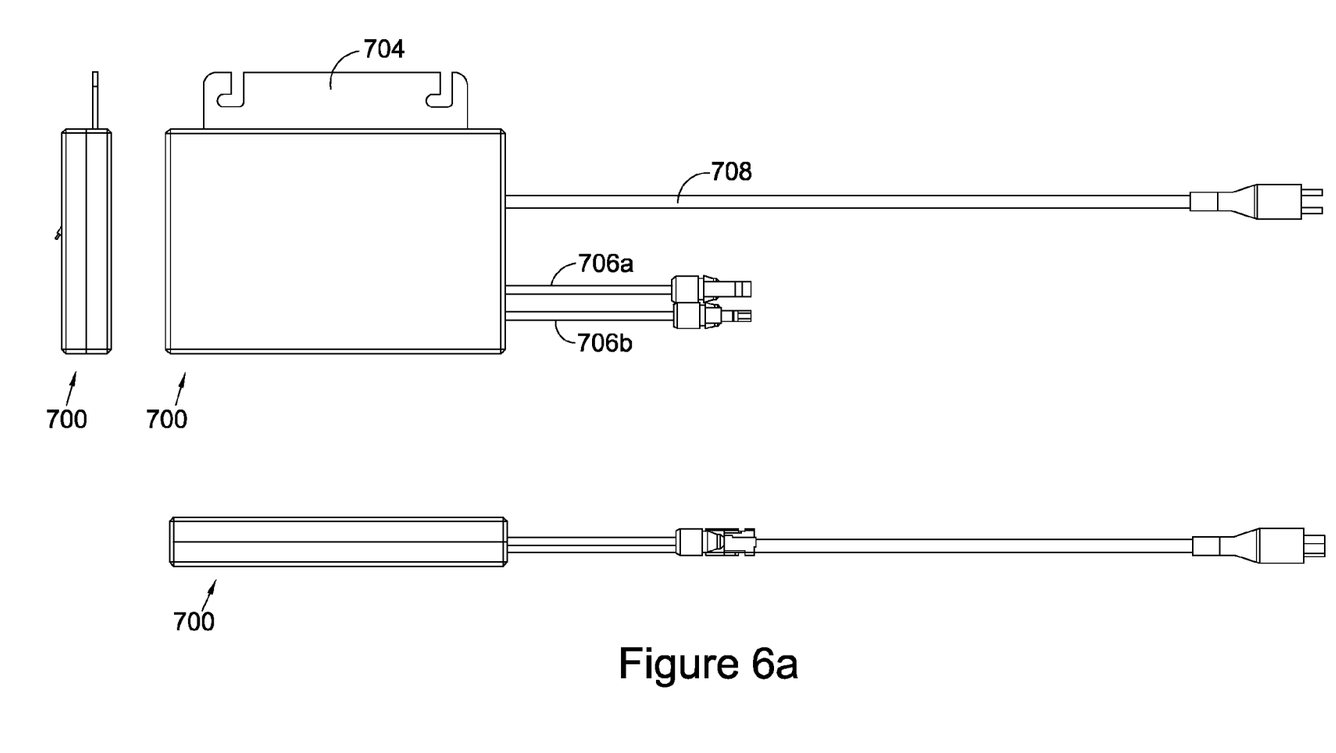
FIGS. 6a and 6b show, respectively, an example of an overmoulded solar photovoltaic inverter according to an embodiment of the invention, and elements of the inverter of FIG. 6a prior to overmoulding.

Referring now to FIG. 6a, this shows a further embodiment of an overmoulded solar photovoltaic inverter 700, showing a view from above and two side elevations. The inverter 700 has a plastic overmould 702, which forms the body of the inverter, into which is moulded a mounting plate 704. In alternative embodiments the mounting may be formed from the overmould itself. The inverter has a pair of cables 706a,b for positive and negative dc connections to a photovoltaic panel, for example of standard MC4 type, and an ac mains output cable 706 bearing a suitable connector at the end.

Figure 6B:
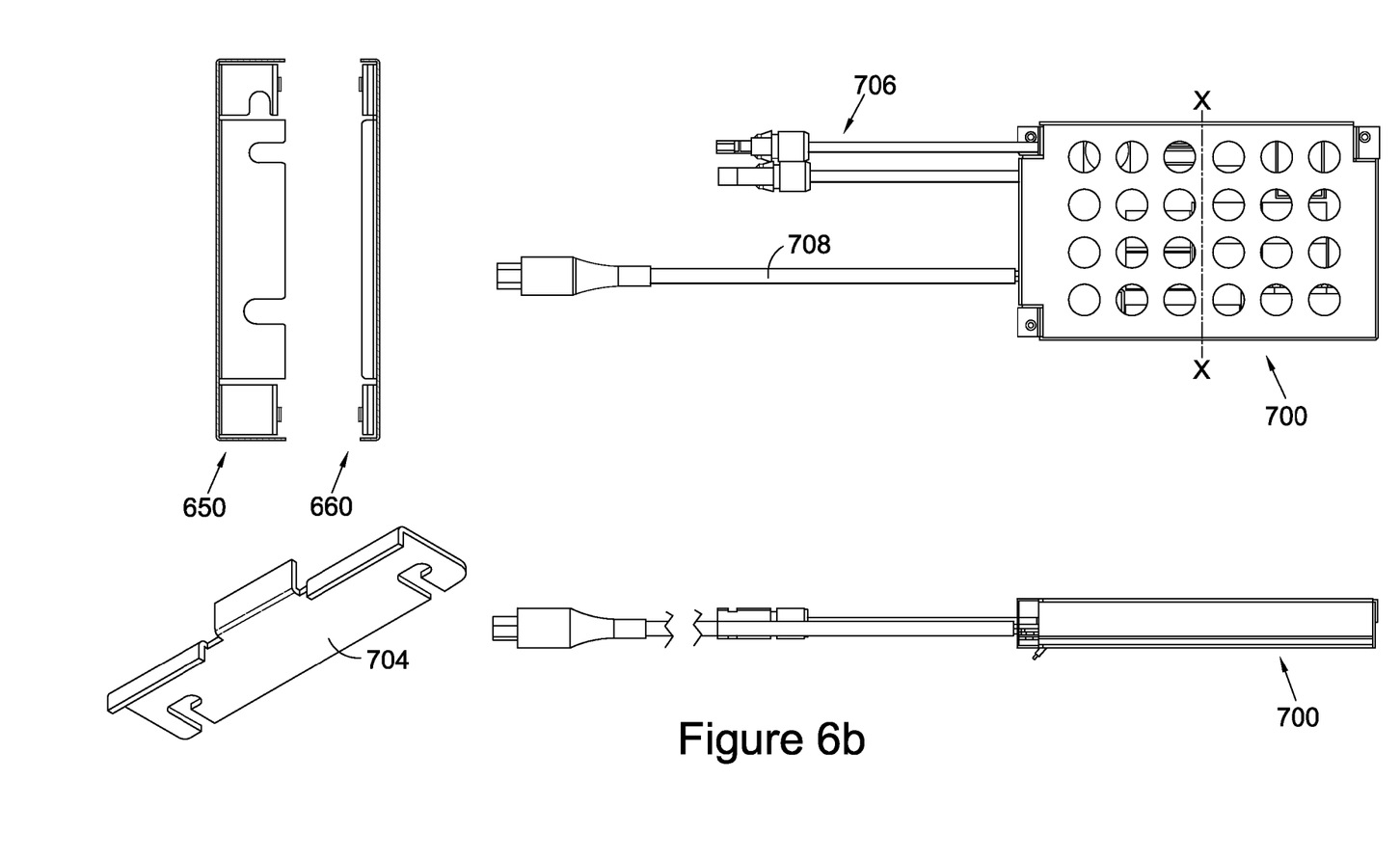

FIG. 6b illustrates components of the inverter 700 prior to overmoulding, showing top and side views of the inverter 700, cross-sectional views of top and bottom electrically conductive shield (Faraday cage) components 750, 760, and the mounting plate 704. As can be, seen the Faraday cage incorporates a plurality of holes to enable the overmoulding to be performed after coating the circuit board with silicone or the like.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A solar photovoltaic inverter, the solar photovoltaic inverter comprising:
a power conditioning circuit mounted on a circuit board, the power conditioning circuit having a dc power input to receive dc power from one or more photovoltaic panels and an ac power output to deliver ac power to an ac mains power supply;
an electrically conductive shield enclosing said circuit board; and
a plastic overmould over said conductive shield and said circuit board;
wherein said electrically conductive shield comprises a set of holes to allow an injection of said plastic overmould through said conductive shield to cover said circuit board, wherein the plastic overmould extends through one or more holes in the set of holes of the conductive shield to encapsulate the solar photovoltaic inverter.

2. The solar photovoltaic inverter of claim 1, wherein said power conditioning circuit comprises at least one coil or transformer having a core, wherein said coil or transformer is coated with an elastic material to permit thermal expansion of said core within said plastic overmould.

3. The solar photovoltaic inverter of claim 2, wherein said power conditioning circuit on said circuit board comprises a dc-to-dc converter having an input coupled to said dc power input and having an output, and a dc-to-ac converter having an input coupled to said output of said dc-to-dc converter and having an output coupled to said ac power output, and wherein said dc-to-dc converter comprises a transformer coupled between said dc power input and said output of said dc-to-dc converter.

4. The solar photovoltaic inverter of claim 1, wherein said power conditioning circuit includes a controller coupled to one or both of an RF transmitter and an RF receiver, and wherein said electrically conductive shield is connected to an RF output of said RF transmitter or to an RF input of said RF receiver to form an antenna.

5. The solar photovoltaic inverter of claim 4, wherein one or more holes in the set of holes have a maximum dimension of less than a free-space wavelength of a transmission frequency or reception frequency of said RF transmitter or receiver respectively.

6. The solar photovoltaic inverter of claim 5, wherein said frequency comprises a frequency in the 2.45 GHz ISM Band, and wherein one or more holes in the set of holes has a maximum dimension of less than 35 mm.

7. The solar photovoltaic inverter of claim 1 wherein said dc power input of said circuit board comprises a modular connector system, said modular connector system comprising a first interface part mounted on said circuit board and a second interface part mateable with said first interface part to provide a connector to a photovoltaic panel, wherein said first interface part is sealed against moisture ingress by said plastic overmould, wherein said second interface part is mateable with said first interface part when said first interface part is sealed by said plastic overmould.

8. The solar photovoltaic inverter of claim 7 comprising a set of said second interface parts each to provide a connection to a different said photovoltaic panel.

9. The solar photovoltaic inverter of claim 1, wherein said plastic overmould is configured to define one or more mounting points for said solar photovoltaic inverter.

10. The solar photovoltaic inverter of claim 1, wherein said solar photovoltaic inverter is a microinverter configured to mount behind or adjacent to a photovoltaic panel.

11. A method of manufacturing a solar photovoltaic inverter, the method comprising:
providing a power conditioning circuit mounted on a circuit board, the power conditioning circuit having a dc power input to receive dc power from one or more photovoltaic panels and an ac power output to deliver ac power to an ac mains power supply;
providing an electrically conductive shield enclosing said circuit board, the electrically conductive shield comprises a set of holes; and
injection moulding a plastic overmould over said conductive shield and through the conductive shield to cover said circuit board, the plastic overmould extending through one or more holes in the set of holes of the conductive shield to encapsulate the solar photovoltaic inverter.

12. The method of claim 11, wherein said power conditioning circuit comprises at least one coil or transformer having a core, the method further comprising coating said coil or transformer with an elastic material prior to said injection moulding to permit thermal expansion of said core within said plastic overmould.

13. The method of claim 11 further comprising using said conductive shield as an antenna for an RF communications circuit of said power conditioning circuit.

14. The method of claim 13 further comprising arranging one or more holes in the set of holes such that they have a maximum dimension of less than a free-space wavelength at a frequency of operation of said RF communications circuit.

15. The method of claim 11 further comprising providing said dc power input of said circuit board with a modular connector system for connecting to any of a set of photovoltaic panels, said modular connector system comprising a first interface part and a set of second interface parts, wherein each of said second interface parts is mateable with said first interface part, wherein each said second interface part is configured to connect to one of said photovoltaic panels of said set of photovoltaic panels, the method further comprising overmoulding said first interface part, selecting a second interface part of the set of second interface parts to connect to a photovoltaic panel in the set of photovoltaic panels with which the solar photovoltaic inverter is to be used, and mating said selected second interface part with said first interface part subsequent to said overmoulding.

16. The method of claim 11, wherein said electrically conductive shield comprises a metal can having first and second can portions configured to fit a perimeter of said circuit board, on opposite sides of said circuit board, the method further comprising spreading and dissipating heat from one or more power components on said circuit board via said overmould and metal can.

17. The method of claim 11, wherein said solar photovoltaic inverter is a microinverter, the method further comprising mounting said microinverter behind or adjacent to a photovoltaic panel.

18. The method of claim 17 further comprising using said overmould to mount said microinverter behind or adjacent to said photovoltaic panel.

* * * * *